US011189532B2

(12) United States Patent
Song et al.

(10) Patent No.: US 11,189,532 B2
(45) Date of Patent: Nov. 30, 2021

(54) DUAL WIDTH FINNED SEMICONDUCTOR STRUCTURE

(71) Applicant: International Business Machines Corporation, Armonk, NY (US)

(72) Inventors: Yi Song, Albany, NY (US); Jay W. Strane, Warwick, NY (US); Eric Miller, Watervliet, NY (US); Fee Li Lie, Albany, NY (US); Richard A. Conti, Katonach, NY (US)

(73) Assignee: International Business Machines Corporation, Armonk, NY (US)

( * ) Notice: Subject to any disclaimer, the term of this patent is extended or adjusted under 35 U.S.C. 154(b) by 44 days.

(21) Appl. No.: 16/714,766

(22) Filed: Dec. 15, 2019

(65) Prior Publication Data

US 2020/0194314 A1   Jun. 18, 2020

Related U.S. Application Data

(63) Continuation of application No. 15/993,419, filed on May 30, 2018, now Pat. No. 10,672,668.

(51) Int. Cl.
*H01L 21/8238* (2006.01)
*H01L 29/66* (2006.01)
(Continued)

(52) U.S. Cl.
CPC .. *H01L 21/823821* (2013.01); *H01L 21/0217* (2013.01); *H01L 21/0276* (2013.01); *H01L 21/3065* (2013.01); *H01L 21/3081* (2013.01); *H01L 21/3086* (2013.01); *H01L 21/31053* (2013.01); *H01L 21/31155* (2013.01);
(Continued)

(58) Field of Classification Search
None
See application file for complete search history.

(56) References Cited

U.S. PATENT DOCUMENTS 6,383,697 B1   5/2002   Vladmirsky et al.
7,608,546 B2   10/2009   Park et al.
(Continued)

OTHER PUBLICATIONS

Castro et al., Selective and Anisotropic Dry Etching of Ge over Si, Journal of Integrated Circuits and Systems, v.8/n.2: 1-4-109 (Year: 2013).
(Continued)

*Primary Examiner* — Shaun M Campbell
*Assistant Examiner* — Aneta B Cieslewicz
(74) *Attorney, Agent, or Firm* — Robert Sullivan; Otterstedt, Wallace & Kammer, LLP

(57) ABSTRACT

A finned semiconductor structure including sets of relatively wide and relatively narrow fins is obtained by employing hard masks having different quality. A relatively porous hard mask is formed over a first region of a semiconductor substrate and a relatively dense hard mask is formed over a second region of the substrate. Patterning of the different hard masks using a sidewall image transfer process causes greater lateral etching of the relatively porous hard mask than the relatively dense hard mask. A subsequent reactive ion etch to form semiconductor fins causes relatively narrow fins to be formed beneath the relatively porous hard mask and relatively wide fins to be formed beneath the relatively dense hard mask.

19 Claims, 7 Drawing Sheets

(51) Int. Cl.
*H01L 21/308* (2006.01)
*H01L 21/3065* (2006.01)
*H01L 21/02* (2006.01)
*H01L 21/3115* (2006.01)
*H01L 29/06* (2006.01)
*H01L 21/3105* (2006.01)
*H01L 27/092* (2006.01)
*H01L 21/027* (2006.01)
*H01L 29/10* (2006.01)
*H01L 21/311* (2006.01)
*H01L 29/786* (2006.01)

(52) U.S. Cl.
CPC ............... *H01L 21/823807* (2013.01); *H01L 21/823892* (2013.01); *H01L 27/0924* (2013.01); *H01L 27/0928* (2013.01); *H01L 29/0673* (2013.01); *H01L 29/1095* (2013.01); *H01L 29/6656* (2013.01); *H01L 21/31111* (2013.01); *H01L 21/823885* (2013.01); *H01L 27/092* (2013.01); *H01L 29/66666* (2013.01); *H01L 29/78642* (2013.01)

(56) References Cited

U.S. PATENT DOCUMENTS

| | | | |
|---|---|---|---|
| 8,656,322 | B1 | 2/2014 | Dechene et al. |
| 9,059,001 | B2 | 6/2015 | Liu et al. |
| 9,064,739 | B2 | 6/2015 | Haensch et al. |
| 9,437,681 | B2 | 9/2016 | Lee et al. |
| 9,735,042 | B2 | 8/2017 | Hung et al. |
| 9,865,710 | B2 | 1/2018 | Liu |
| 2010/0308409 | A1* | 12/2010 | Johnson .......... H01L 21/823807 257/368 |
| 2012/0217594 | A1* | 8/2012 | Kajiyama ............ H01L 27/228 257/421 |
| 2016/0027775 | A1 | 1/2016 | Akarvardar et al. |
| 2017/0069528 | A1 | 3/2017 | Huang et al. |
| 2017/0170313 | A1 | 6/2017 | Chan et al. |
| 2017/0250183 | A1 | 8/2017 | Brunco |
| 2017/0358660 | A1* | 12/2017 | Cheng ............... H01L 21/02129 |
| 2017/0373165 | A1 | 12/2017 | Ge |
| 2018/0006138 | A1* | 1/2018 | Cheng ............... H01L 29/66795 |
| 2018/0069003 | A1 | 3/2018 | Cheng et al. |
| 2019/0371678 | A1 | 12/2019 | Song et al. |

OTHER PUBLICATIONS

Paul J. Otterstedt, List of IBM Patents or Patent Applications Treated as Related, Jan. 15, 2020, pp. 1-2.

* cited by examiner

DUAL WIDTH FINNED SEMICONDUCTOR STRUCTURE

CROSS-REFERENCE TO RELATED APPLICATION

This application is a continuation of U.S. patent application Ser. No. 15/993,419 filed May 30, 2018, now U.S. Pat. No. 10,672,668, the complete disclosure of which is expressly incorporated herein by reference in its entirety for all purposes.

BACKGROUND

The present application relates generally to the electrical, electronic and computer arts and, more particularly, to finned semiconductor structures employed in the fabrication of FinFET devices, vertical transistor devices, and other electronic devices.

Fin-type field-effect transistors (FinFETs) have three-dimensional, non-planar configurations including fin-like structures extending vertically above substrates. The substrates may include semiconductor on insulator (SOI) substrates or bulk semiconductor substrates. Silicon fins are formed in some FinFETs on substrates via known technology such as sidewall image transfer (SIT). FinFET structures including SOI substrates can be formed, in part, by selectively etching the crystalline silicon layers down to the oxide or other insulating layers thereof following photolithography. Active fin heights are set by SOI thickness when employing SOI substrates. In bulk FinFETs, active fin height is set by oxide thickness and etched fin height. Impurities can be introduced below the fins to provide a punch through stop (PTS). Punch through isolation of fins in bulk FinFET devices is provided to avoid leakage and is typically formed with the well implant. A relatively deep implant is required for relatively tall fins. The gates of FinFETs can be formed using a "gate-first" process wherein a gate stack and spacers are formed prior to selective epitaxial growth wherein source and drain regions are enlarged. A "gate-last" process may alternatively be employed wherein the source/drain regions are formed following fin patterning.

Nanosheet FETs have been under development for possible use in tight pitch applications such as 7 nm nodes and beyond. Such FETs include multiple channel layers, each channel layer being separated by a gate stack including a layer of electrically conductive gate material and a gate dielectric layer. The gate stacks wrap around all sides of the channel layers, thereby forming a gate-all-around (GAA) structure. Epitaxial regions on the ends of the nanosheet channel layers form source/drain regions of the nanosheet FETs. Spacers are employed for electrically isolating the gates from the source/drain regions of nanosheet transistors.

Vertical field-effect transistors (VFETs) are characterized by doped, possibly vertical channel regions, p-n junctions on one or more sides of the channels, and ohmic contacts forming the source and drain regions vertically rather than horizontally.

Both nFET and pFET devices are often formed on the same substrate. In CMOS integration, nFET and pFET devices have different immunities from short channel effects (SCEs) as well as different source/drain resistances due to different dopant diffusion rates under the same thermal conditions. For multi-gate devices such as FinFETs, electron-hole mobility cannot be optimized at a single cross-fin dimension ($D_{fin}$) due to the different scattering mechanisms. FinFET, vertical transistors and nanosheet transistors can benefit by using different $D_{fin}$ for pFET and nFET devices. Typically pFET devices should have smaller $D_{fin}$ in view of relatively poor SCEs immunity. Hole mobility is less sensitive to $D_{fin}$ thus smaller $D_{fin}$ for PFET devices is desirable. Relatively thin fins could be obtained using an additional patterning and fin trimming process. However, the additional lithography required would increase cost and could introduce defects that might affect yield. The fin trimming process, if through oxidation/etching, could cause vertical non-uniformity problems.

BRIEF SUMMARY

Techniques are provided for forming fins having different critical dimensions on the same substrate.

In one aspect, an exemplary fabrication method of fabricating a semiconductor structure including vertical elements having different widths includes obtaining a monolithic structure including a semiconductor substrate having first and second regions, the first region being laterally displaced with respect to the second region. A first hard mask is formed over the first region of the semiconductor substrate and a second hard mask is formed over the second region of the semiconductor substrate. The first hard mask has greater porosity than the second hard mask. A plurality of spacers is formed on the first and second hard masks. The first and second hard masks are then subjected to a first anisotropic etching process, thereby forming vertical openings therein between the spacers and laterally etching portions of the first and second hard masks directly beneath the spacers. The portions of the first, relatively porous, hard mask beneath the spacers undergo more lateral etching than the portions of the second hard mask beneath the spacers during the first anisotropic etching process. The monolithic structure is then subjected to anisotropic etching using the patterned hard masks, thereby forming first and second sets of vertically extending fins from the monolithic structure. The first set of fins formed beneath the portions of the relatively porous, first hard mask have narrower average widths than the second set of fins. The first set of fins includes first dielectric caps comprising portions of the first hard mask and the second set of fins include second dielectric caps comprising portions of the second hard mask.

A further method of fabricating a semiconductor structure including vertical elements having different average widths includes forming a first well having a first conductivity type in a first region of a semiconductor substrate and forming a second well having a second conductivity type opposite from the first conductivity type in a second region of the semiconductor substrate. A first silicon nitride layer is formed over the first and second regions of the semiconductor substrate. A vertical opening extending through the first silicon nitride layer and above the second region of the semiconductor substrate is formed. A second silicon nitride layer having a different porosity than the first silicon nitride layer is formed over the first silicon nitride layer and within the vertical opening. A dielectric layer is deposited over a top surface of the second silicon nitride layer and planarized down to the top surface of the second silicon nitride layer such that a portion of the dielectric layer remains over the second region of the semiconductor substrate. A portion of the second silicon nitride layer over the first region of the semiconductor substrate is removed. The method further includes removing the portion of the dielectric layer remaining over the second region of the semiconductor substrate, wherein the first silicon nitride layers comprises a first hard mask over the first region of the semiconductor substrate and the second silicon nitride layer comprises a second hard mask over the second region of the semiconductor substrate. A plurality of spacers is formed on the first and second hard masks using a sidewall image transfer process. The first and second hard masks are subjected to a first anisotropic etching process, thereby forming vertical openings in the first and second hard masks between the spacers and laterally etching portions of the first and second hard masks directly beneath the spacers, the portions of one of the first and second hard masks beneath the spacers undergoing more lateral etching than the portions of the other of the first and second hard masks beneath the spacers during the first anisotropic etching process. First and second sets of vertically extending fins are formed from the semiconductor substrate using a second anisotropic etching process. The fins within the first set have narrower average widths than the fins within the second set. The first set of fins include first dielectric caps comprising the portions of one of the first and second hard masks and the second set of fins include second dielectric caps comprising the portions of the other of the first and second hard masks.

In another aspect, an exemplary monolithic semiconductor structure includes a semiconductor substrate including an n-well and a p-well, a set of parallel first fins extending vertically from the semiconductor substrate and having bottom ends adjoining the n-well, and a set of parallel second fins extending vertically from the semiconductor substrate and having bottom ends adjoining the p-well. The average width of the second fins is greater than the average width of the first fins. The set of parallel first fins includes a first set of dielectric caps and the set of parallel second fins includes a second set of dielectric caps. The first set of dielectric caps has greater porosity than the second set of dielectric caps.

Techniques as disclosed herein can provide substantial beneficial technical effects. By way of example only and without limitation, one or more embodiments may provide one or more of the following advantages:
Optimizing electron/hole mobility of nFET and pFET devices formed on the same substrate;
Generating different fin critical dimensions in nFET and pFET regions at the same etch;
Generating different fin critical dimensions in nFET and pFET regions without additional fin trimming;
Fins of selected width self-aligned to well locations;
Avoidance of pitchwalk problems;
CMOS device performance is boosted by optimizing $D_{fin}$ for nFET and pFET devices, respectively.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 3CC is a schematic, cross-sectional view showing the structure illustrated in FIG. 3B following anisotropic deposition of a second silicon nitride layer after the mask layer is removed;

FIG. 3DD is a schematic, cross-sectional view showing the structure illustrated in FIG. 3CC following deposition of a dielectric layer thereon;

FIG. 3EE is a schematic, cross-sectional view showing the structure illustrated in FIG. 3DD following planarization;

Figure 1:
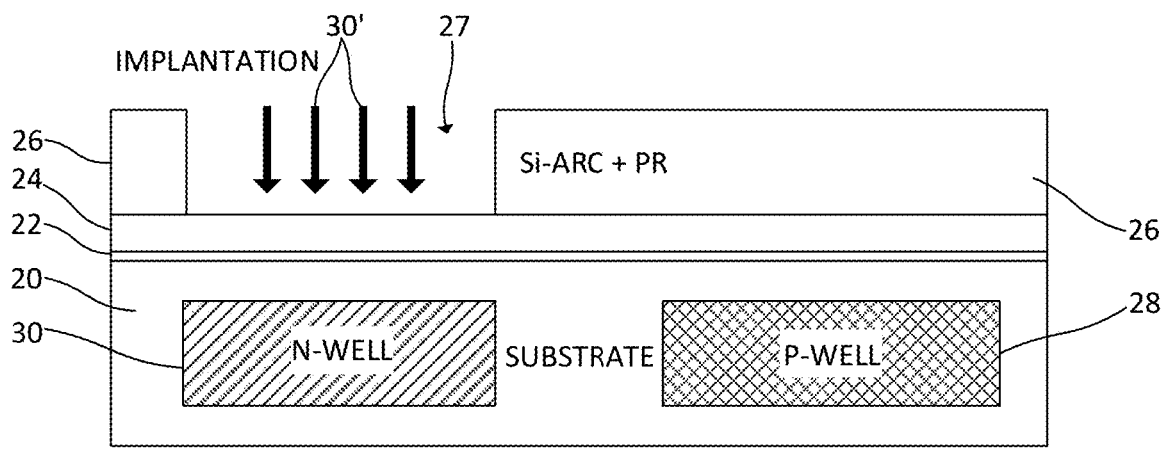
FIG. 1 is a schematic, cross-sectional view of a semiconductor substrate showing implantation of a deep well.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the inventions described herein are presented in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

One or more embodiments provide a finned structure including sets of fins having different thicknesses formed on the same substrate. An exemplary fabrication method for forming the structure is further described.

Fabrication processes as disclosed herein can be employed in the fabrication of structures including vertical elements such as semiconductor fins in the pFET region of a semiconductor substrate having a relatively small $D_{fin}$ while the fins in the nFET region of the substrate have a larger $D_{fin}$. The fins in both regions can be fabricated using a single anisotropic etch process. Optimization of electron/hole mobility may accordingly be facilitated.

Lateral etch rate adjustment techniques in a single RIE are employed to obtain different $D_{fin}$ during the fabrication of a semiconductor structure including vertical elements such as fins. By providing hard masks having different porosity and which are laterally etched at different rates, each set of underlying fins can have a different $D_{fin}$ without the need for subsequent fin trimming, where $D_{fin}$=spacer defined hard mask width−2×lateral etch width.

Silicon nitride has been employed in the semiconductor industry to form elements such as hard masks, barriers and spacers. The compound can be deposited using a number of techniques that can affect its physical characteristics. Physical vapor deposition (PVD) and high density plasma chemical vapor deposition (HDP-CVD) are two such techniques. Silicon nitride layers can alternatively be subjected to processes such as implantation after deposit that can affect physical properties such as porosity of the deposited layer. The deposition rate of dielectric films such as silicon nitride can also influence porosity. Higher deposition rates are typically associated with increasing porosity while lower deposition rates are likely to form higher density layers. High quality silicon nitride layers are generally characterized by relatively high density and relatively low porosity. Silicon nitride layers having different physical characteristics are employed in the processes discussed below to allow the fabrication of semiconductor structures having vertical structures including different critical dimensions in different regions of the structures.

A first exemplary process may be employed in the fabrication of nFET and pFET devices on the same substrate. A bulk substrate 20 consisting essentially of undoped crystalline silicon is shown in FIG. 1, it being appreciated that standard silicon substrates may have a very low level of p-doping. The substrate may be in the form of a wafer. It will be appreciated that a silicon on insulator (SOI) substrate (not shown) may alternatively be employed in performing the exemplary processes disclosed herein. A pad oxide layer 22 adjoins the top surface of the substrate and a hydrogen-rich silicon nitride layer 24 adjoins the pad oxide layer. The silicon nitride layer has a thickness of thirty nanometers (30 nm), it being appreciated that a thicker or thinner nitride layer may alternatively be employed. A three-layer mask 26 is formed on the silicon nitride layer 24. The mask includes an organic dielectric layer (ODL), a photoresist (PR) layer, and a silicon-containing anti-reflective coating (Si-ARC) between the ODL and PR layers. An opening 27 in the mask 26 is shown in FIG. 1. The opening can be formed by patterning the PR layer and then etching the underlying Si-ARC and ODL layers. A hydrogen/nitrogen gas can be employed for removing the exposed region of the Si-ARC and ODL layers. Arrows 30' in the figure indicate the implantation of the n-type ions such as arsenic forming the n-well region 30. A p-type dopant previously implanted in the nFET region form a p-well region 28 in the silicon substrate. The ion energy range is such that, in some embodiments, the n-well and p-well regions are formed at a depth between 50-120 nm from the top surface of the substrate and have a thickness between 100-300 nm. The structure is annealed following ion implantation. As used herein, the term "conductivity type" denotes a doped region (such as regions 28, 30) being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contributes free electrons to an intrinsic semiconductor. Examples of n-type dopants, i.e., impurities in a silicon-containing substrate include but are not limited to antimony, arsenic and phosphorous.

Following completion of n-well implantation, the silicon nitride layer 24 above the p-well region 28 is implanted with ions to change the physical characteristics thereof. Implantation of various species/heat to cure the as-deposited hydrogen rich SiN can change the properties of SiN film. The implant can be nitrogen, silicon or other higher atomic mass species such as Ar and Zr. The species would break bonds and let the hydrogen go, thus increasing the density of the implanted portion of the SiN film. Implantation would make this change greater after annealing depending on the following anneal conditions, such as using laser RTP and furnace anneal. In one exemplary embodiment, a thermal anneal at 900° C. for about 6~120 seconds follows implantation of Ar or Zr. Implantation depth is controlled to avoid damaging the underlying substrate 20. The resulting silicon nitride layer will accordingly have a relatively dense portion above the p-well and a relatively porous portion above the n-well. A relatively dense silicon nitride layer reduces lateral etch rate and facilitates the production of semiconductor fins having a relatively large critical dimension CD, as discussed further below. The relatively porous portion of the silicon nitride layer above the n-well 30 facilitates the production of fins having a relatively small CD that can be used in pFET fabrication.

FIGS. 2A-2E illustrate sequential steps of an alternative process flow for fabricating semiconductor fins having relatively small and large $D_{fin}$ dimensions in the nFET and pFET regions of a semiconductor substrate. The alternative process, like that described above with respect to FIG. 1, provides hard mask portions having different physical characteristics that impact $D_{fin}$ through fin RIE. The same reference numerals are employed in FIGS. 2A-2E to designate the same or similar elements present in FIG. 1.

Figure 2A:
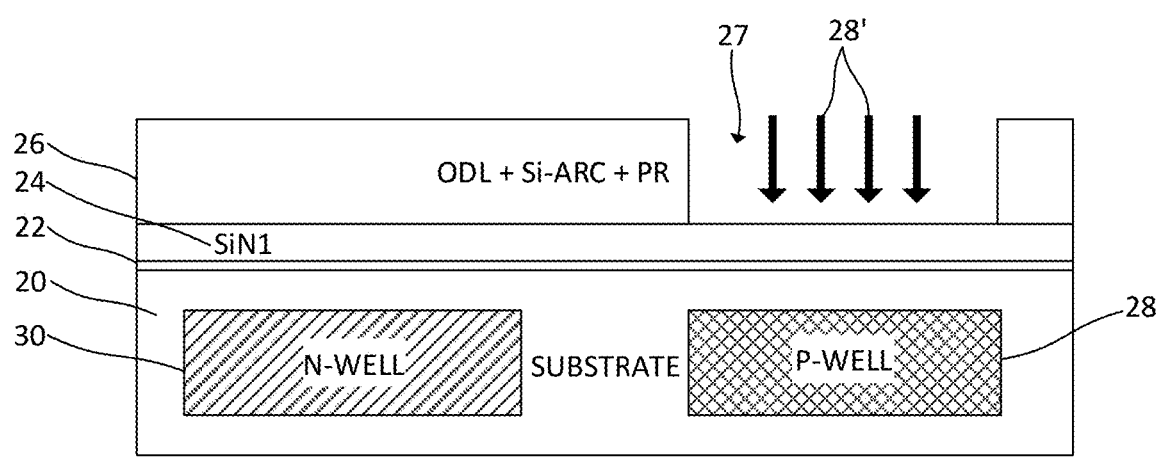
FIG. 2A is a is a schematic, cross-sectional view of a structure including a semiconductor substrate showing implantation of a deep well following removal of a portion of a hard mask in an nFET (p-well) region of the substrate.

Referring to FIG. 2A, the three-layer mask 26 is patterned and the substrate 20 is subjected to ion implantation 28' to form the p-well 28 while the pFET portion of the substrate is protected by the remaining portion of the mask 26. The portion of the silicon nitride hardmask layer 24 (SiN1 in the drawings) over the nFET (p-well) portion of the semiconductor substrate 20 is then removed using a suitable etch process such as RIE. The pad oxide layer 22 remains on the top surface of the substrate in the nFET region.

Figure 2B:
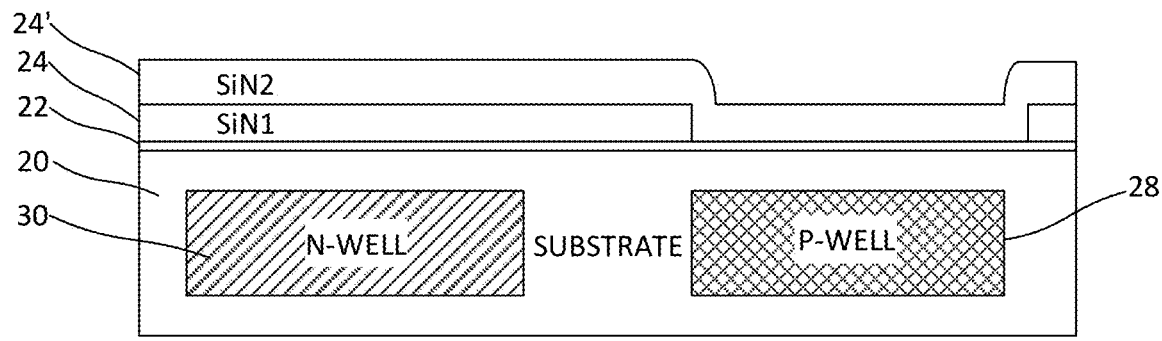
FIG. 2B is a is a schematic, cross-sectional view showing deposition of a second silicon nitride layer on the structure shown in FIG. 2A.

A second silicon nitride layer 24' (SiN2 in the drawings) is conformally deposited on the structure following removal of the three-layer mask 26 and surface cleaning to obtain the structure shown in FIG. 2B. The bottom silicon nitride layer 24, which covers the pFET region of the substrate after patterning, has relatively high porosity. The later-deposited silicon nitride layer 24' would have relatively low porosity and higher resistance to etching than the bottom silicon nitride layer 24.

Figure 2C:
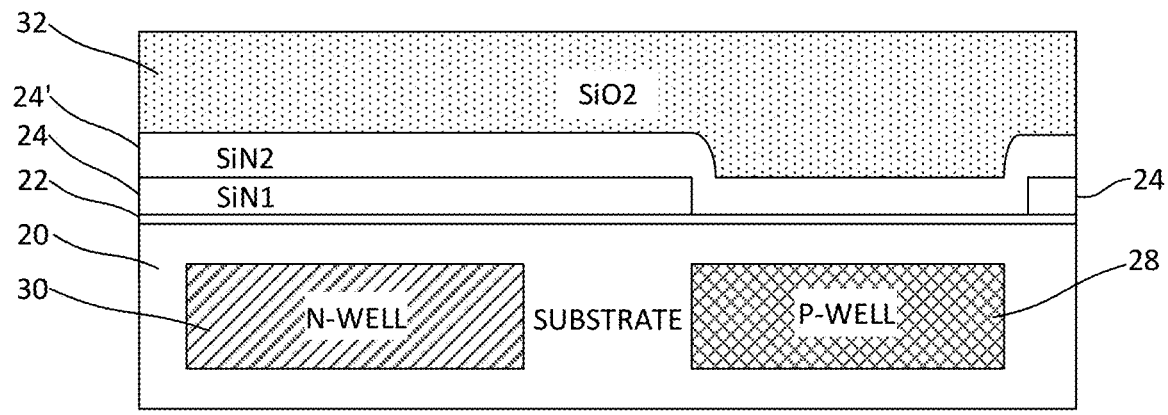
FIG. 2C is a is a schematic, cross-sectional view showing deposition of a dielectric layer on the structure shown in FIG. 2B.
Figure 2D:
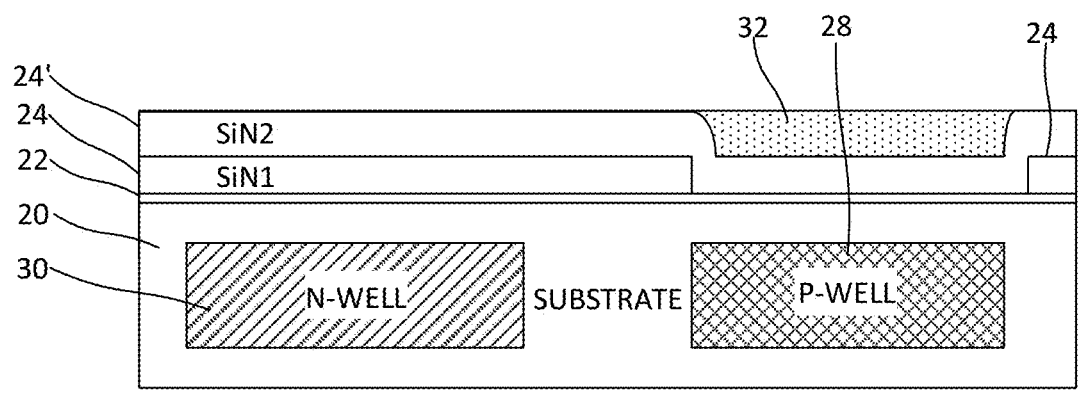
FIG. 2D is a schematic, cross-sectional view showing the structure illustrated in FIG. 2C following planarization.

A dielectric layer 32 such as silicon dioxide is deposited over the top silicon nitride layer 24' and then subjected to an initial timed chemical mechanical planarization (CMP) process. The silicon dioxide layer facilitates the CMP process so a stop layer (SiN1 layer) can be detected as an ending point. The dielectric layer 32 continues to cover the entire structure following the initial CMP and has a planar top surface, as shown in FIG. 2C. A second CMP process is then performed on the dielectric layer 32 down to the top surface of the portion of the top silicon nitride layer 24' above the n-well. As shown in FIG. 2D, a portion of the dielectric layer 32 remains on the portion of the top silicon nitride layer 24' above the p-well. The top surface of the dielectric layer 32 is coplanar with the top surface of the top silicon nitride layer 24' that extends over the n-well.

Figure 2E:
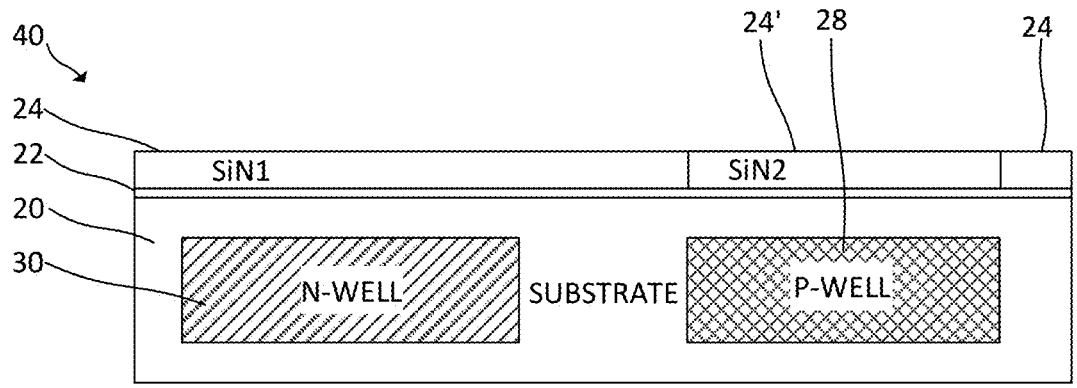
FIG. 2E is a schematic, cross-sectional view showing the structure illustrated in FIG. 2D following further planarization.

A third CMP process is conducted, ending at the top surfaces of the bottom silicon nitride layer 24 and the top (later-deposited) silicon nitride layer 24' that remain over the n-well and p-well, respectively. Alternatively, a timed etch of the top silicon nitride layer 24' and oxide layer 32 is employed to obtain a structure 40 as shown in FIG. 2E. The structure 40 includes a semiconductor substrate including a pFET region and an nFET region. A low density more porous silicon nitride layer 24 extends over the pFET region. A relatively high density less porous silicon nitride layer 24' extends over the nFET region of the substrate. The remaining portions of the silicon nitride layers form a continuous, hard mask layer having uniform thickness. As discussed further below, the structure 40 can be employed for forming parallel semiconductor fins having different critical dimensions in the nFET and pFET regions upon patterning of the silicon nitride (hard mask) layer 24, 24' and fin RIE.

Figure 3A:
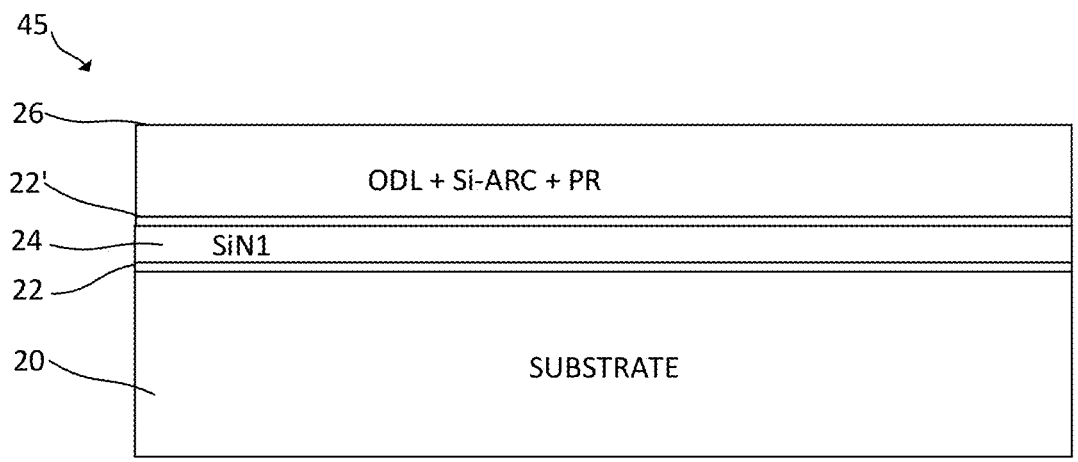
FIG. 3A is a schematic, cross-sectional view showing a structure including a semiconductor substrate including dielectric layers (oxide/nitride/oxide) and a mask layer thereon.
Figure 3B:
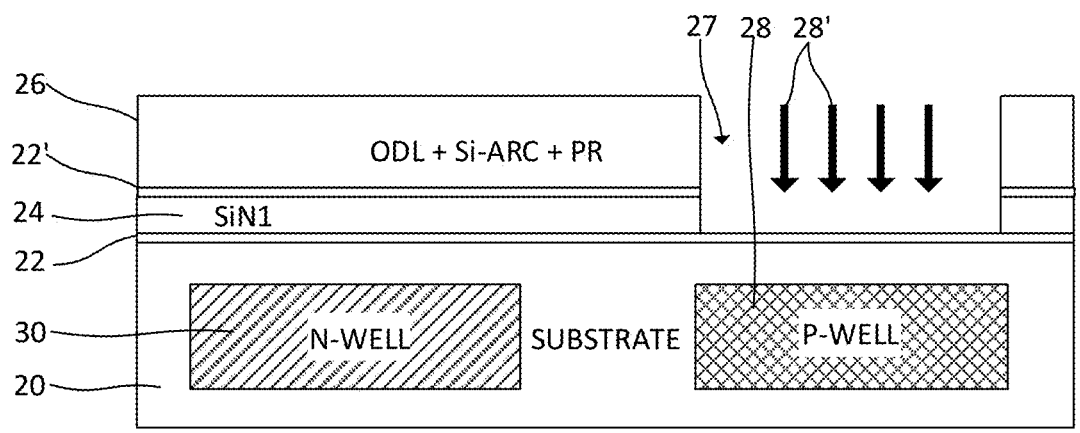
FIG. 3B is a schematic, cross-sectional view showing the structure of FIG. 3A following removal of selected portions of the dielectric layers and the mask layer in nFET (p-well) region of the substrate.

A further exemplary process for obtaining a structure that facilitates forming parallel semiconductor fins having different critical dimensions on the same substrate is illustrated in FIGS. 3A-3E. A monolithic structure 45 including a semiconductor substrate 20, a pad oxide layer 22, a silicon nitride layer 24, a top oxide layer 22' and a three layer mask 26 is provided. The top oxide layer 22' is deposited on the silicon nitride layer 24 and is positioned between this layer and the three-layer mask 26. The pad oxide layer and the top oxide layer may have thicknesses in the range of 2-30 nm in some embodiments. The mask 26 is patterned to form a recess 27 over the nFET region of the substrate 20 so that a portion of the substrate can be subjected to ion implantation 28' to form a p-well 28, as shown in FIG. 3B. Portions of the silicon nitride layer and top oxide layer are removed prior to ion implantation, forming the recess 27 extending down to the pad oxide layer 22. The pad oxide layer 22 remains on the top surface of the substrate 20 following partial removal of the top oxide and silicon nitride layers. The pFET region of the substrate, which already includes an n-well, is protected by the mask 26 during ion implantation.

Figure 3C:
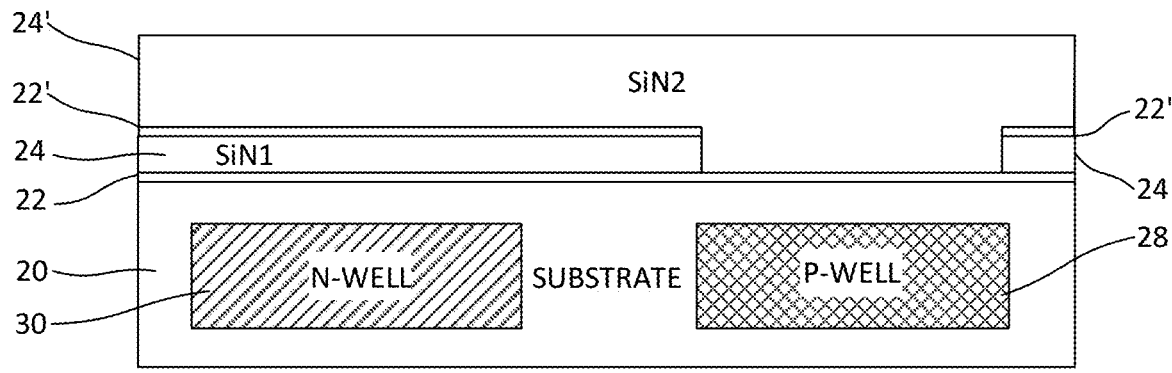
FIG. 3C is a schematic, cross-sectional view showing the structure illustrated in FIG. 3B following deposition of a second silicon nitride layer following removal of the remainder of the mask layer.
Figure 3D:
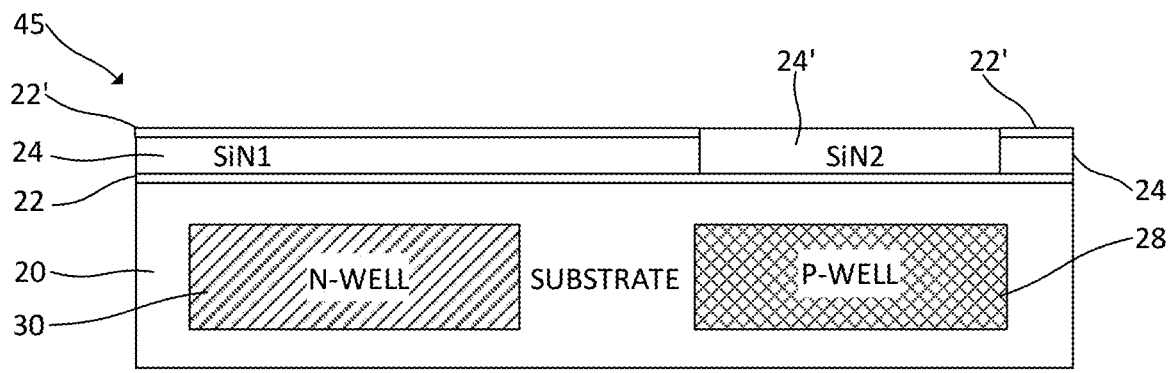
FIG. 3D is a schematic, cross-sectional view thereof following planarization.
Figure 3E:
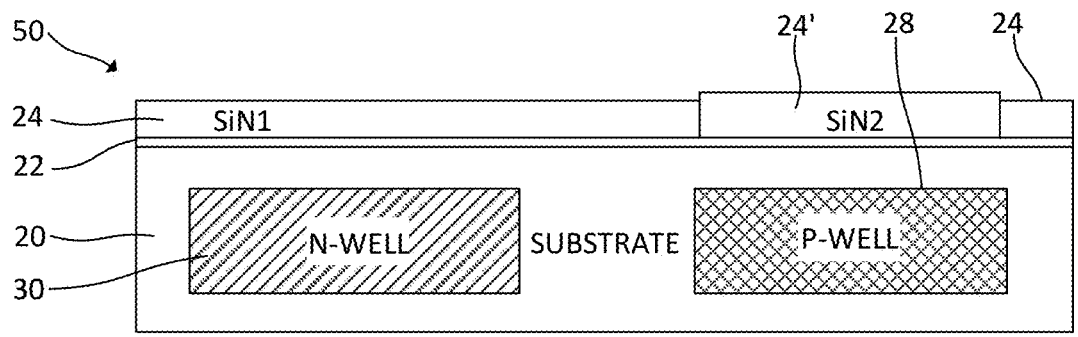
FIG. 3E is a schematic, cross-sectional view showing the structure illustrated in FIG. 3D following removal of a top oxide layer.
Figure 3C:
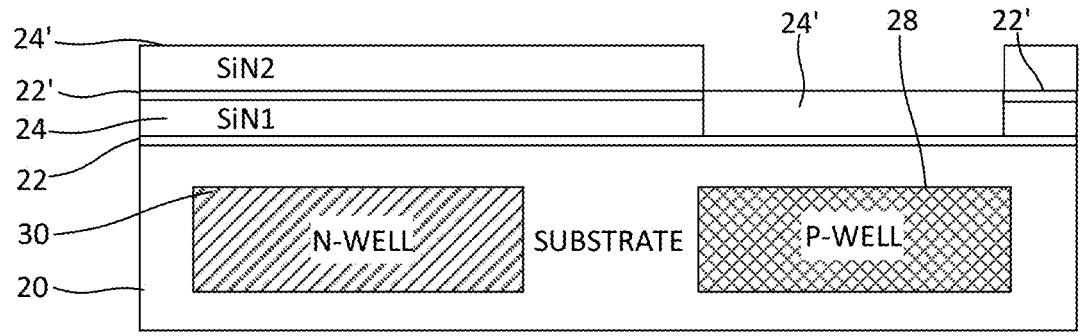
Figure 3D:
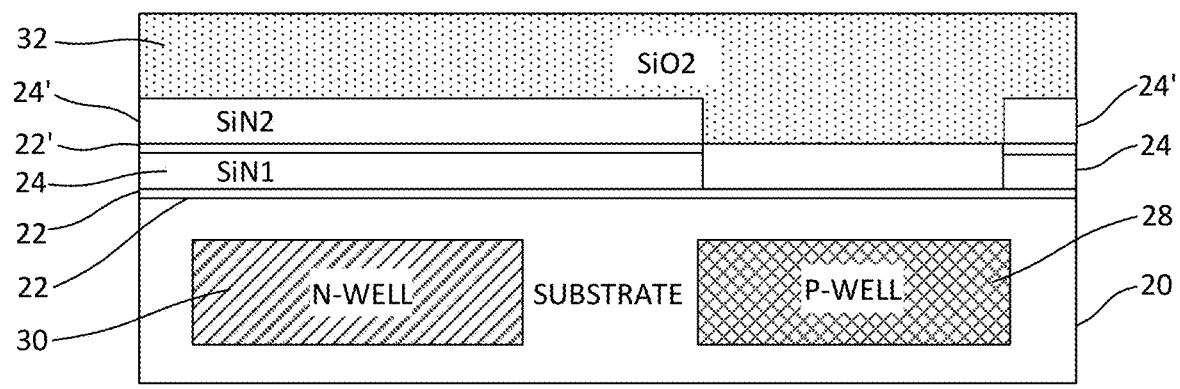
Figure 3E:
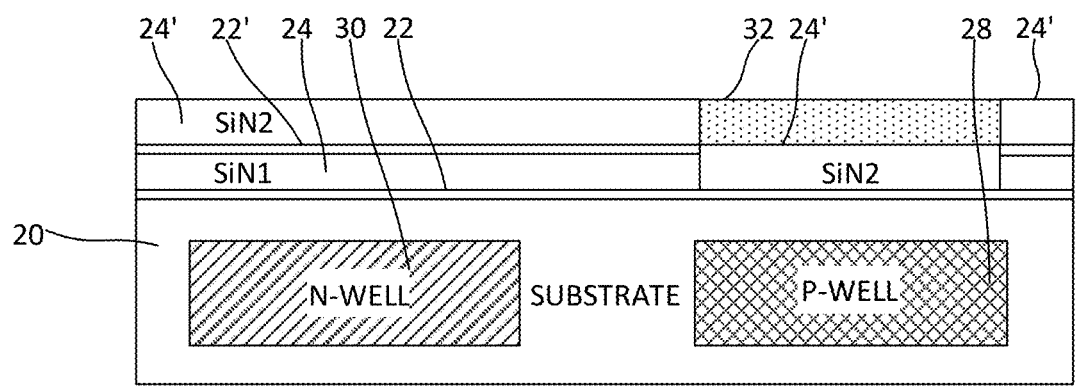

Referring to FIG. 3C, the mask 26 is removed, the top surface of the structure is cleaned, and a top silicon nitride layer 24' is deposited. The top silicon nitride layer 24' has a different porosity than the bottom silicon nitride layer 24. The top silicon nitride layer 24' is relatively dense (less porous) if employed in the fabrication of fins for nFETs having larger critical dimensions than the fins used for forming pFETs on the same substrate. The density (porosity) of SiN can be characterized by lateral etch rate. The larger the lateral etch rate, the poorer the density/more porous the SiN is. The top silicon nitride layer 24' is subjected to a first CMP to obtain the structure shown in FIG. 3C. A second CMP is employed to remove material from the top silicon nitride layer 24' down to the top oxide layer 22' to obtain a structure 45 as shown in FIG. 3D. The top oxide layer 22' is an ending layer for CMP to stop. The top oxide layer 22' is optionally removed from the top surface of the bottom silicon nitride layer 24 over the n-well 30. The resulting structure 50 as shown in FIG. 3E includes a hybrid silicon nitride layer 24, 24' on the substrate having regions of different porosity. The later-deposited portion of the silicon nitride layer has a slightly greater thickness than originally deposited portion thereof following removal of the top oxide layer therefrom.

A further alternative process flow is illustrated in part in FIGS. 3CC-3GG. The structures shown in FIGS. 3A and 3B are first obtained prior to beginning this process flow. Following removal of the three-layer mask 26 and cleaning of the structure shown in FIG. 3B, a top silicon nitride layer 24' (SiN2) having different porosity than the originally deposited silicon nitride layer 24 is anisotropically deposited. The anisotropic deposition is important to make sure the SiN2 in the trench has the same thickness as the SiN1 layer 24. SiN2 deposition can be high temperature HDP or PVD nitride. The porosity of SiN can be controlled during deposition by changing deposition conditions, such as temperature, pressure or by incorporating more or less hydrogen. SiN1 has more porous SiN deposition; such deposition could be either low temperature PECVD nitride or low temperature HDP nitride. Physical vapor deposition (PVD) may be employed to obtain the anisotropic top silicon nitride layer 24'. As shown in FIG. 3CC, the top silicon nitride layer 24' adjoins the top oxide layer 22' on the originally deposited silicon nitride layer 24 above one region of the substrate. Another portion of the top silicon nitride layer 24' adjoins the pad oxide layer 22 above the p-well in a second region of the substrate 20 later used for forming nFET devices.

A dielectric layer 32 such as a silicon dioxide layer is deposited on the structure and subjected to a first chemical mechanical planarization process to obtain a structure as shown in FIG. 3DD. A second CMP process is performed to remove the dielectric material down to the top surface of the top silicon nitride layer 24' above the substrate region including the n-well 30 in the exemplary embodiment, thereby obtaining a structure as shown in FIG. 3EE. The top surface of the remaining dielectric material above the portion of the substrate 20 including the p-well 28 is coplanar with the top surface of the portion of the top silicon nitride layer 24' above the n-well.

Figure 3F:
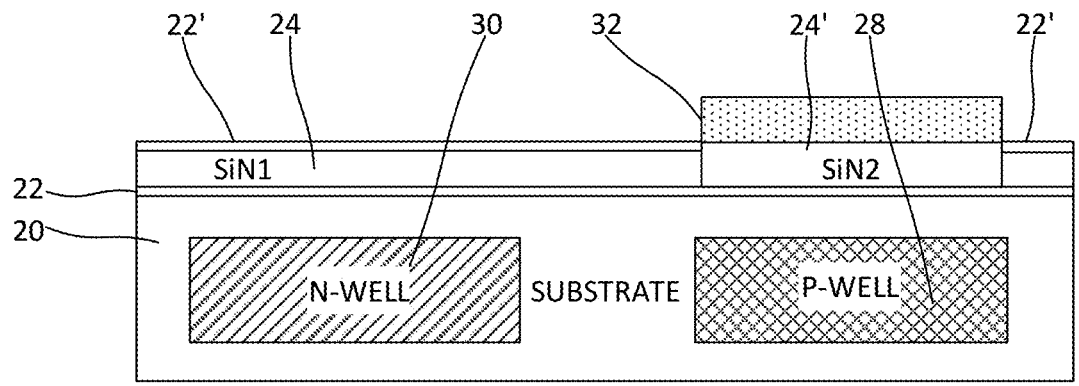
FIG. 3FF is a schematic, cross-sectional view showing the structure illustrated in FIG. 3EE following removal of the portion of the second silicon nitride layer over the pFET (n-well) region of the substrate.
Figure 3G:
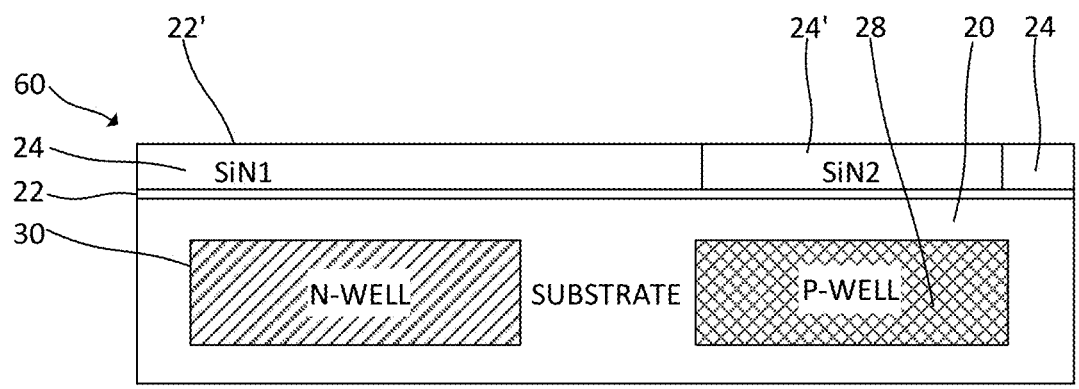
FIG. 3GG is a schematic, cross-sectional view showing the structure of FIG. 3FF following removal of a top oxide layer.

Referring to FIG. 3FF, the structure is subjected to a selective wet etch such as a hot phosphoric acid etch to remove the portions of the top silicon nitride layer 24' that adjoin the top oxide layer 22'. The oxide materials comprising the remaining portion of the dielectric layer 32 and the top oxide layer 22' are removed using hydrofluoric acid (HF) or other suitable selective wet etching process. The resulting structure 60, shown in FIG. 3GG, includes a continuous silicon nitride layer forming a hard mask comprised of adjoining regions of differing porosity. The top surfaces of the adjoining hard mask regions are substantially coplanar.

Figure 4:
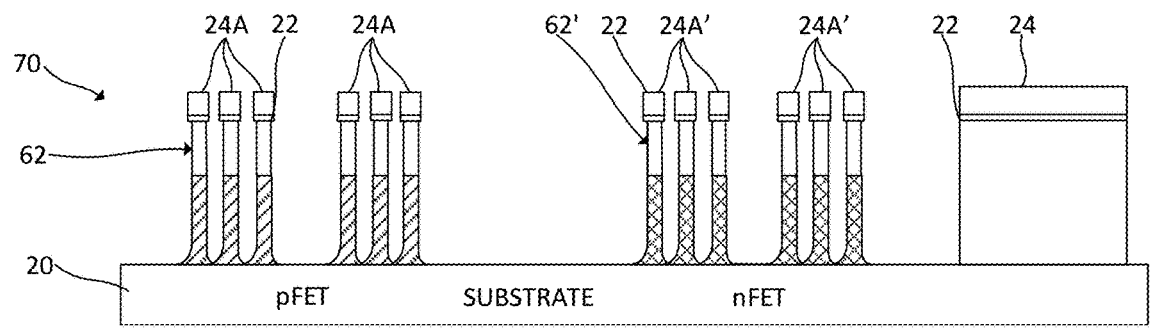
FIG. 4 is a schematic, cross-sectional view showing a finned semiconductor structure fabricated from a structure as shown in FIG. 3HH.

FIG. 4 depicts a finned structure 70 formed from any one of the structures 40, 50, 60 discussed above. The height and widths of the fins 62 and fin pitch are chosen to meet the specifications of the electronic devices formed thereon. Fin pitch is 25-50 nm in some embodiments. In one exemplary embodiment, fin pitch is thirty-two nanometers (32 nm and the spaces 23 between fins are twenty-four nanometers (24 nm). Fin widths in the nFET region are larger than those in the pFET region. Fin width in the pFET region may, for example, be about eight nanometers (8 nm).

Methods of forming semiconductor fins 22 using photolithography or sidewall image transfer (SIT) are familiar to those of skill in the art. SIT facilitates the fabrication of fins that are smaller in spacing than photolithographic techniques permit. An SIT process employed to pattern the silicon nitride hard mask allows the formation of vertical features (such as fins) in the underlying substrate using fin RIE with a pitch equal to half of the smallest pitch obtainable with lithography. The fin sidewalls in both regions are not entirely vertical, the bottoms of the fins 62, 62' being larger in width than the top portions thereof. If a semiconductor substrate 20 in an exemplary embodiment is a (100) substrate, the side wall surfaces of the semiconductor fins described as (110) surfaces are at least close to being (110) surfaces but may or may not be exactly (110) surfaces. Fin width dimensions are accordingly average dimensions where fin width is not uniform. Once the structure 70 shown in FIG. 4 is obtained, selective cutting of one or more of the fins 62 is performed and the area(s) of the structure to be used to form FinFETs are masked with an oxide or nitride ($Si_3N_4$) layer (not shown).

Figure 3H:
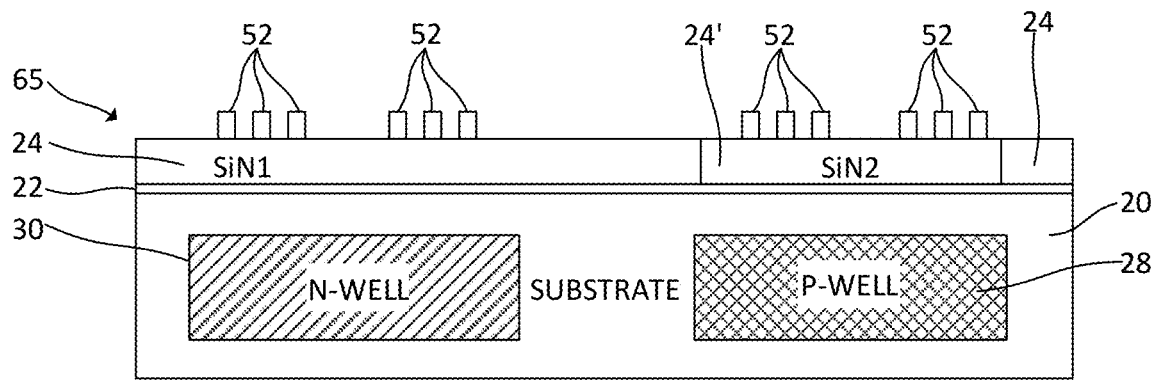
FIG. 3HH is a schematic, cross sectional view showing the structure of FIG. 2E, 3E or 3GG following formation of spacers on the first and second silicon nitride layers.

The different qualities of the hard mask comprised by the layers 24, 24' on the semiconductor substrate 20 facilitate fabrication of sets of fins 62, 62' or other vertical structures having different widths in different regions of the substrate. Sidewall image transfer (SIT) technology is employed to pattern the hard mask prior to fin formation. Such technology includes the formation of mandrels on the hard mask and spacers on the mandrels. Upon selective removal of the mandrels, the spacers 52, as schematically illustrated in FIG. 3HH, remain on the hard mask and form a template for patterning the hard mask (24, 24') below. The spacers throughout the wafer should have the same width. In practice, a perfect anisotropic etch is not feasible. Accordingly, etching of the silicon nitride material beneath the spacers 52 is both vertical and lateral during RIE of the hard mask on the substrate 20. The final CDs (initial spacer CD minus the hard mask CD after RIE) will be different depending on the RIE bias, which is defined as original spacer thickness minus two times lateral etch depth, due to the different qualities (etch resistance) of the hard mask. Following hard mask patterning using the spacers 52, the regions of the hard mask having greater porosity will have smaller widths (smaller CD) than the hard mask regions of greater density (less porosity) following SIT due to greater lateral etching of the relatively porous hard mask region during the anisotropic etch. A specific etch for patterning the silicon nitride hard mask could be fluorocarbon-based or $CF_x$ based RIE. Once the hard mask is patterned using SIT, the final semiconductor fin etch is performed in a single fin RIE using a SiN hard mask having regions (24A, 24A' shown in FIG. 4) with different CDs. The final semiconductor fin CDs will accordingly be different as the semiconductor material used to form fins is protected by hard mask material having relatively wide or relatively narrow width.

Referring again to FIG. 4, the hard mask portions used for fin RIE remain on the semiconductor fins 62, 62' as dielectric caps 24A, 24A' following fin formation. The caps 24A on a first set of fins 62 are formed beneath the spacers 52 following the SIT patterning of the initially deposited dielectric layer 24 while the caps 24A' on the second set of fins 62' are formed by patterning the subsequently deposited layer 24'. The structure 70 shown in FIG. 4 includes relatively narrow fins 62 formed in the pFET region and relatively wide fins 62' formed in the nFET region of the substrate. The dielectric caps 24A, being formed from a relatively low quality (porous) silicon nitride material, are narrower than the caps 24A' in the nFET region that are formed from higher quality silicon nitride material. The thickness of the caps 24A, 24A' is the same in embodiments wherein fins are formed from the structures 40, 60 discussed above having hard masks of uniform thickness and regions of different mask porosity.

Figure 5:
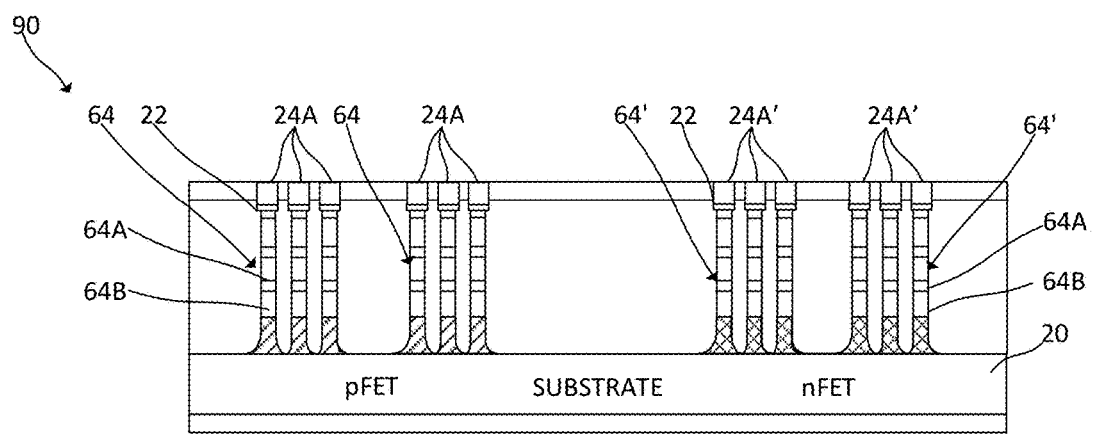
FIG. 5 is a schematic, cross-sectional view showing a finned semiconductor structure including nanosheet layers.

Dual $D_{fin}$ structures formed using techniques as discussed above can be used in fabricating FinFETs as well as any kind of multigate device that requires different $D_{fin}$ for boosting device performance, such as nanosheet transistors and vertical transistors. FIG. 5, for example, schematically illustrates a monolithic structure 90 including fins 64, 64' including nanosheet stack layers 64A, 64B. In some embodiments, each fin includes a stack of semiconductor layers including silicon layers and silicon germanium layers grown epitaxially in alternating sequence. The fins 64' in the nFET region are wider than those 64 in the pFET region of the substrate 20 resulting from the use of hard masks of different porosity. The structure 90 may be obtained from an initial structure similar to that shown in FIG. 3A with the pad oxide layer 22, silicon nitride layer 24, top oxide layer 22' and mask 26 deposited on a monolithic structure including a stack of nanosheet layers formed on the substrate 20 rather than directly on the top surface of a semiconductor substrate as shown. The processing of the monolithic structure including nanosheet layers is substantially the same as described above.

FIGS. 1, 2A-2E, 3A-3E and 3A/3B-3HH, as discussed above, depict exemplary processing steps/stages in the fabrication of monolithic structures that can be employed in the fabrication of finned semiconductor structures usable to manufacture FinFET devices. An exemplary finned semiconductor structure is shown in FIG. 4. Although the overall fabrication method and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling* 1$^{st}$ *Edition*, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

Given the discussion thus far, it will be appreciated that, in general terms, methods of fabricating semiconductor structures including vertical elements having different widths are provided. Such methods include obtaining a monolithic structure including a semiconductor substrate 20 having first and second regions, for example nFET and pFET regions. The first region is laterally displaced with respect to the second region. A first hard mask 24 is formed over the first region of the semiconductor substrate and a second hard mask 24' is formed over the second region, the first hard mask having greater porosity than the second hard mask. The first and second hard masks are subjected to a sidewall image transfer process wherein a plurality of spacers 52 is formed thereon, as schematically illustrated in FIG. 3HH. The spacers 52 have the same widths in one or more exemplary embodiments. The first and second hard masks are subjected to a first anisotropic etching process, thereby forming vertical openings in the first and second hard masks between the spacers. The first anisotropic etch, while primarily providing vertical etching of the hard mask materials unprotected by the spacers, also causes some lateral etching of the portions of the first and second hard masks directly beneath the spacers. The portions of the first hard mask beneath the spacers 52, being relatively low quality, undergo more lateral etching than the less porous portions of the second hard mask beneath the spacers during anisotropic etching. The monolithic structure is subjected to a second anisotropic etching process, for example a silicon etch, thereby forming first and second sets of vertically extending, fins from the monolithic structure. The fins comprising the first set have narrower widths than the second set of fin-like elements following the second anisotropic etch. The first set of fin-like elements include first dielectric caps comprising the portions of the first hard mask formed beneath the spacers and the second set of fins include second dielectric caps comprising the portions of the second hard mask formed beneath the spacers. FIG. 4 shows an exemplary structure including fins 62, 62' having dielectric caps 24, 24' formed from the patterning of the two hard masks. The method may further include forming an n-well 30 in the first region of the semiconductor substrate 20 forming a p-well 28 in the second region of the semiconductor substrate. In some embodiments, forming the first and second sets of vertically extending, fins from the monolithic structure further includes forming first and second sets of semiconductor fins 62, 62' from the semiconductor substrate usable as FinFET channels. The first and second hard masks consist essentially of silicon nitride in one or more embodiments. The material for hard mask is not confined to silicon nitride as discussed above in the exemplary embodiments; it could alternatively be oxide, carbon, or an organic dielectric layer in one or more embodiments, provided that, like the silicon nitride employed in the exemplary embodiments, the chosen hard mask material has different lateral etch rates in different regions of the substrate to facilitate the fabrication of vertical structures (e.g. fins) having different widths. In some embodiments, forming the one hard mask further includes implanting ions into a region of the other hard mask to increase or decrease the density thereof. In some other embodiments, an opening is formed in the first, relatively porous hard mask 24 over the second region of the semiconductor substrate and forming the second hard mask within the opening. FIGS. 2A-2E and FIGS. 3A-3E show two exemplary processes that may be employed in such other embodiments. In accordance with a method exemplified by FIGS. 3CC-3HH, the method includes forming a pad oxide layer 22 on the semiconductor substrate, forming an n-well 30 in the first region of the semiconductor substrate, forming a p-well 28 in the second region of the semiconductor substrate, forming a first silicon nitride layer 24 on the pad oxide layer, forming a top oxide layer 22' on the first silicon nitride layer 24, forming a vertical opening 27 extending through the top oxide layer and the silicon nitride layer (FIG. 3B), forming a second silicon nitride layer 24' having a different porosity than the first silicon nitride layer within the vertical opening, wherein one of the first and second silicon nitride layers comprises the first hard mask and the other of the first and second silicon nitride layers comprises the second hard mask.

Monolithic semiconductor structures such as schematically illustrated in FIG. 4 and FIG. 5 are also provided in accordance with the principles of the inventions disclosed herein. A semiconductor substrate 20 includes an n-well 30 and a p-well 28. A first set of parallel first fins 62 (or 64) extends vertically from the semiconductor substrate and has bottom ends adjoining the n-well. A set of parallel second fins 62' (or 64') extends vertically from the semiconductor substrate and has bottom ends adjoining the p-well. The average width of the second fins is greater than an average width of the first semiconductor fins. (Second fin $D_{fin}$ exceeds first fin $D_{fin}$.) A first set of dielectric caps 24 are on the set of parallel first fins and a second set of dielectric caps 24' are on the set of parallel second fins. The first set of dielectric caps has greater porosity than the second set of dielectric caps.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having FinFETs, VFETs or nanosheet transistors formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can possibly be substituted for the specific embodiment(s) shown. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method of fabricating a semiconductor structure including sets of vertically extending fins having different average widths, comprising:

obtaining a monolithic structure including a semiconductor substrate having first and second regions, the first region being laterally displaced with respect to the second region;

forming an n-well in the first region of the semiconductor substrate;

forming a p-well in the second region of the semiconductor substrate;

forming a first dielectric hard mask over the first region of the semiconductor substrate;

forming a second dielectric hard mask over the second region of the semiconductor substrate, the first dielectric hard mask having greater porosity than the second dielectric hard mask;

forming spacers on the first and second dielectric hard masks;

subjecting the first and second dielectric hard masks to a first anisotropic etching process, thereby forming vertical openings in the first and second dielectric hard masks between the spacers and laterally etching portions of the first and second dielectric hard masks directly beneath the spacers, the portions of the first dielectric hard mask beneath the spacers undergoing more lateral etching than the portions of the second dielectric hard mask beneath the spacers during the first anisotropic etching process; and subjecting the monolithic structure to a second anisotropic etching process, thereby forming first and second sets of vertically extending fins from the monolithic structure, the first set of fins adjoining the n-well and having narrower average widths than the second set of fins, the first set of fins including first dielectric caps comprising the portions of the first dielectric hard mask, the second set of fins adjoining the p-well and including second dielectric caps comprising the portions of the second dielectric hard mask.

2. The method of claim 1, wherein forming the first and second sets of vertically extending fins further includes forming first and second sets of semiconductor fins from and integral with the semiconductor substrate.

3. The method of claim 2, wherein forming the second dielectric hard mask further includes implanting ions into a region of a silicon nitride layer above the second region of the semiconductor substrate.

4. The method claim 2, further including:
forming a pad oxide layer on the semiconductor substrate;
forming an opening in the first dielectric hard mask over the second region of the semiconductor substrate down to the pad oxide layer, and
forming the second dielectric hard mask within the opening.

5. The method of claim 2, wherein forming the second dielectric hard mask further includes implanting ions into a region of the first dielectric hard mask above the second region of the semiconductor substrate.

6. The method of claim 1, wherein the first and second sets of fins comprise stacks of nanosheet semiconductor layers.

7. The method of claim 1, wherein the spacers have the same width dimension.

8. The method of claim 1, wherein the first dielectric hard mask and the second dielectric hard mask form a continuous hard mask layer having uniform thickness.

9. A method of fabricating a semiconductor structure including sets of vertically extending fins having different average widths, comprising:

obtaining a monolithic structure including a semiconductor substrate having first and second regions, the first region being laterally displaced with respect to the second region;

forming a first dielectric hard mask over the first region of the semiconductor substrate;

forming a second dielectric hard mask over the second region of the semiconductor substrate, the first dielectric hard mask having greater porosity than the second dielectric hard mask;

forming spacers on the first and second dielectric hard masks;

subjecting the first and second dielectric hard masks to a first anisotropic etching process, thereby forming vertical openings in the first and second dielectric hard masks between the spacers and laterally etching portions of the first and second dielectric hard masks directly beneath the spacers, the portions of the first dielectric hard mask beneath the spacers undergoing more lateral etching than the portions of the second dielectric hard mask beneath the spacers during the first anisotropic etching process;

subjecting the monolithic structure to a second anisotropic etching process, thereby forming first and second sets of vertically extending fins from the monolithic structure, the first set of fins having narrower average widths than the second set of fins, the first set of fins including first dielectric caps comprising the portions of the first dielectric hard mask, the second set of fins including second dielectric caps comprising the portions of the second dielectric hard mask; and further including:

forming a pad oxide layer on the semiconductor substrate;

forming an n-well in the first region of the semiconductor substrate;

forming a p-well in the second region of the semiconductor substrate;

forming a first silicon nitride layer on the pad oxide layer;

forming a top oxide layer on the first silicon nitride layer;

forming a vertical opening extending through the top oxide layer and the first silicon nitride layer, and forming a second silicon nitride layer having a different porosity than the first silicon nitride layer within the vertical opening, wherein one of the first and second silicon nitride layers comprises the first dielectric hard mask and the other of the first and second silicon nitride layers comprises the second dielectric hard mask.

10. The method of claim 9, wherein the vertical opening is formed above the p-well and the second silicon nitride layer comprises the second dielectric hard mask.

11. The method of claim 9, wherein forming the second silicon nitride layer includes anisotropically depositing the second silicon nitride layer on the pad oxide layer.

12. The method of claim 9, wherein forming the first silicon nitride layer includes depositing the first silicon nitride layer at a first deposition rate and wherein forming the second silicon nitride layer includes depositing the second silicon nitride layer at a second deposition rate lower than the first deposition rate.

13. The method of claim 9 wherein forming the second silicon nitride layer includes anisotropically depositing the second silicon nitride layer.

14. The method of claim 13, wherein forming the first silicon nitride layer includes forming a low temperature PECVD silicon nitride layer or a low temperature HDP-CVD silicon nitride layer.

15. The method of claim 14, wherein forming the second silicon nitride layer includes forming a high temperature PVD silicon nitride layer or a high temperature HDP-CVD silicon nitride layer.

16. A method of fabricating a semiconductor structure including sets of vertically extending fins having different average widths, comprising:

obtaining a monolithic structure including a semiconductor substrate having first and second regions, the first region being laterally displaced with respect to the second region;

forming a first dielectric hard mask over the first region of the semiconductor substrate;

forming a second dielectric hard mask over the second region of the semiconductor substrate, the first dielectric hard mask having greater porosity than the second dielectric hard mask;

forming spacers on the first and second dielectric hard masks;

subjecting the first and second dielectric hard masks to a first anisotropic etching process, thereby forming vertical openings in the first and second dielectric hard masks between the spacers and laterally etching portions of the first and second dielectric hard masks directly beneath the spacers, the portions of the first dielectric hard mask beneath the spacers undergoing more lateral etching than the portions of the second dielectric hard mask beneath the spacers during the first anisotropic etching process; and subjecting the monolithic structure to a second anisotropic etching process, thereby forming first and second sets of vertically extending fins from the monolithic structure, the first set of fins having narrower average widths than the second set of fins, the first set of fins including first dielectric caps comprising the portions of the first dielectric hard mask, the second set of fins including second dielectric caps comprising the portions of the second dielectric hard mask; and wherein:

forming the first dielectric hard mask over the first region of the semiconductor substrate further includes depositing a hydrogen rich silicon nitride layer; and forming the second dielectric hard mask over the second region of the semiconductor substrate further includes causing release of hydrogen from a portion of the first dielectric hard mask.

17. The method of claim 16, wherein causing release of hydrogen from the portion of the first dielectric hard mask further includes implanting the portion of the first dielectric hard mask with ions.

18. The method of claim 17, further including annealing the portion of the first dielectric hard mask following implanting the portion of the first dielectric hard mask with ions.

19. The method of claim 17, further including:

forming a first well having n-type conductivity in the first region of the semiconductor substrate; and forming a second well having p-type conductivity in the second region of the semiconductor substrate.

* * * * *